United States Patent
Boyd et al.

(10) Patent No.: US 7,231,682 B1
(45) Date of Patent: Jun. 19, 2007

(54) METHOD AND APPARATUS FOR SIMULTANEOUSLY CLEANING THE FRONT SIDE AND BACK SIDE OF A WAFER

(75) Inventors: John M. Boyd, Atascadero, CA (US); Katrina Mikhaylich, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 635 days.

(21) Appl. No.: 10/652,648

(22) Filed: Aug. 28, 2003

(51) Int. Cl.
*B08B 1/04* (2006.01)
*B08B 3/12* (2006.01)

(52) U.S. Cl. ........................................ 15/77; 15/88.3
(58) Field of Classification Search .................... 15/77, 15/88.2, 88.3, 102
See application file for complete search history.

(56) References Cited

U.S. PATENT DOCUMENTS

| | | | | |
|---|---|---|---|---|
| 5,660,642 A | * | 8/1997 | Britten | ........................ 134/30 |
| 5,675,856 A | * | 10/1997 | Itzkowitz | ........................ 15/77 |
| 5,906,687 A | * | 5/1999 | Masui et al. | .................. 134/1.3 |
| 6,175,983 B1 | * | 1/2001 | Hirose et al. | .................. 15/102 |
| 6,334,229 B1 | * | 1/2002 | Moinpour et al. | ............. 15/77 |
| 6,951,042 B1 | * | 10/2005 | Mikhaylichenko et al. | .... 15/77 |
| 2002/0062839 A1 | * | 5/2002 | Verhaverbeke et al. | ...... 134/1.3 |

FOREIGN PATENT DOCUMENTS

| | | | |
|---|---|---|---|
| JP | 2-271622 | * | 11/1990 |
| WO | 00/59006 | * | 10/2000 |

* cited by examiner

*Primary Examiner*—Mark Spisich
(74) *Attorney, Agent, or Firm*—Martine Penilla & Gencarella, LLP (57) ABSTRACT

A method for cleaning a semiconductor substrate is provided. The method initiates with transferring the semiconductor substrate into a chamber. Then, a first side of the semiconductor substrate is cleaned according to a first cleaning technique. A second side of the semiconductor substrate is simultaneously cleaned according to a second cleaning technique. The semiconductor substrate is then transferred from the chamber. A system and apparatus for simultaneously cleaning opposing sides of a semiconductor substrate are also provided.

14 Claims, 14 Drawing Sheets

METHOD AND APPARATUS FOR SIMULTANEOUSLY CLEANING THE FRONT SIDE AND BACK SIDE OF A WAFER

BACKGROUND OF THE INVENTION

The present invention relates generally to surface cleaning and, more particularly, to a method and apparatus for applying a hybrid cleaning scheme to opposing sides of a substrate.

Megasonic cleaning is widely used in semiconductor manufacturing operations and can be employed in a batch cleaning process or a single wafer cleaning process. For a batch cleaning process, the vibrations of a megasonic transducer creates sonic pressure waves in the liquid of the cleaning tank which contains a batch of semiconductor substrates. A single wafer megasonic cleaning process uses a transducer of a size generally less than the area of the wafer substrate above a rotating wafer, wherein the transducer is scanned across the wafer, or in the case of full immersion a single wafer tank system is used. In each case, the main particle removal mechanisms with megasonic cleaning are due to cavitation and acoustic streaming. Cavitation is the rapid forming and collapsing of microscopic bubbles in a liquid medium under the action of sonic agitation. Upon collapse, the bubbles release energy which assists in particle removal through breaking the various adhesion forces which adhere the particle to the substrate. Acoustic streaming is the fluid motion induced by the acoustic wave transmission through the fluid.

Figure 1A:
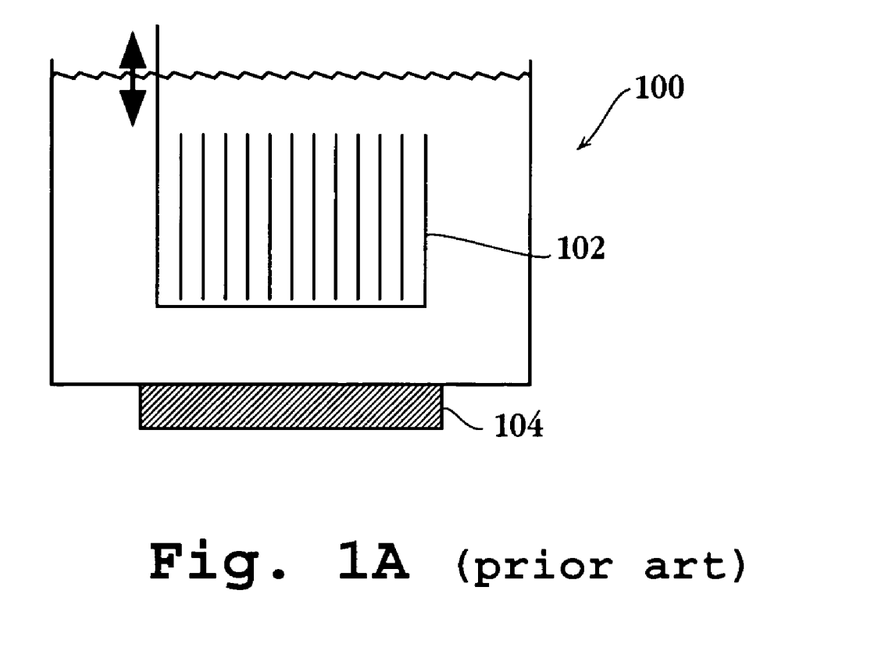
FIG. 1A is a schematic diagram of a batch megasonic cleaning system.

FIG. 1A is a schematic diagram of a batch megasonic cleaning system. Tank 100 is filled with a cleaning solution. Wafer holder 102 includes a batch of wafers to be cleaned. Transducer 104 creates pressure waves through sonic energy with frequencies near 1 Megahertz (MHz). These pressure waves, in concert with the appropriate chemistry to control and inhibit particle re-adhesion, provide the cleaning action. Because of the long cleaning time required for batch cleaning systems, as well as chemical usage, efforts have been focused on single wafer cleaning systems in order to decrease chemical usage, increase wafer-to-wafer control, and decrease defects in accordance with the International Technology Roadmap for Semiconductors (ITRS) requirements. Batch systems suffer from another disadvantage in that the delivery of megasonic energy to the multiple wafers in the tank is non-uniform and can result in 'hot spots' due to constructive interference, or 'cold spots' due to destructive interference, each being caused by reflection of the megasonic waves from both the multiple wafers and from the megasonic tank. Therefore, a higher megasonic energy must be applied in order to reach all regions of the wafers in wafer holder 102.

Figure 1B:
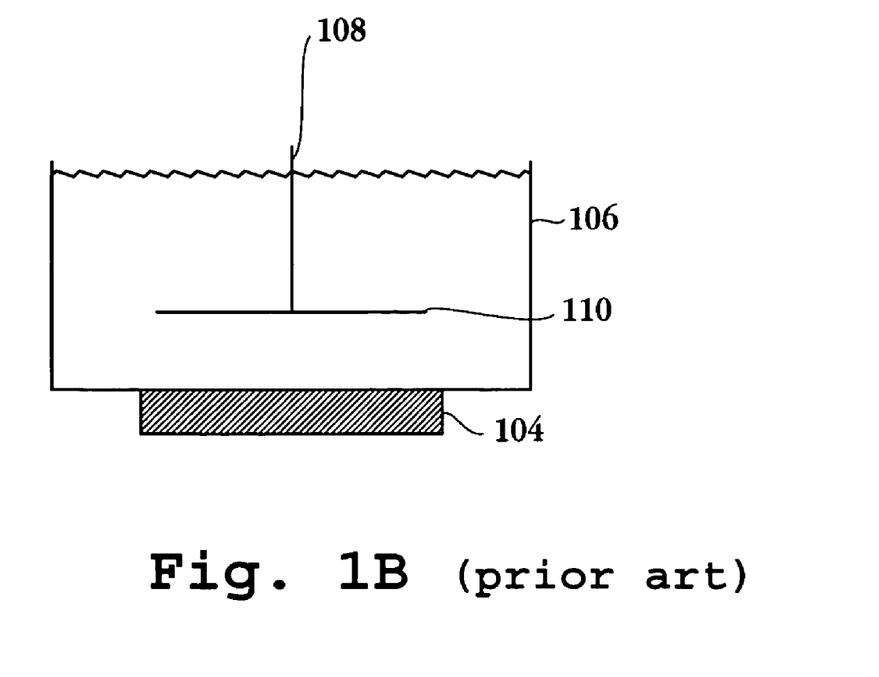
FIG. 1B is a schematic diagram of a single wafer cleaning tank.

FIG. 1B is a schematic diagram of a single wafer cleaning tank. Here, tank 106 is filled with a cleaning solution. Wafer 110, supported by carrier 108, is submerged in the cleaning solution of tank 106. Transducer 104 supplies the energy to clean wafer 110. The cleaning solutions are typically designed to modify the zeta potential between the surfaces of the wafer and a particle removed from the surface of the wafer through the acoustic energy supplied by transducer 104. The cleaning solution concentration should be maintained within a fairly tight range in order to maintain a suitable zeta potential between the surfaces. However, for features such as lines, contacts, spaces, vias, etc., defined on a surface of the substrate, the particle may redeposit on the surface of the substrate due to the inability to maintain a specific cleaning solution concentration, i.e., replenish the cleaning solution, within the region defined by the feature. Another shortcoming of the single wafer cleaning tank configuration is that the side of the substrate not facing the megasonic transducer does not see the megasonic energy. Since upwards of 90% of the megasonic energy is absorbed by the substrate, the opposing side is effectively shielded form the megasonic energy. As a result, in order to clean the opposing side, the substrate must be flipped or transferred to an additional cleaning station. Consequently, the throughput is reduced because of the additional processing.

In view of the foregoing, there is a need for a method and apparatus to provide a single wafer megasonic cleaning configuration that is capable of cleaning both sides of a substrate effectively and simultaneously.

SUMMARY OF THE INVENTION

Broadly speaking, the present invention fills these needs by providing a method and apparatus for alternative cleaning techniques to opposing sides of a substrate simultaneously. It should be appreciated that the present invention can be implemented in numerous ways, including as a method, a system, or an apparatus. Several inventive embodiments of the present invention are described below.

In one embodiment, a method for cleaning a semiconductor substrate is provided. The method initiates with transferring the semiconductor substrate into a chamber. Then, a first side of the semiconductor substrate is cleaned according to a first cleaning technique. A second side of the semiconductor substrate is simultaneously cleaned according to a second cleaning technique. The semiconductor substrate is then transferred from the chamber.

In another embodiment, a system for cleaning a semiconductor substrate is provided. The system includes a chamber configured to support the semiconductor substrate. The chamber includes an acoustic energy cleaning tool configured to be applied to a feature side of the semiconductor substrate and a brush cleaning tool configured to be applied to a non-feature side of the semiconductor substrate. A fluid delivery system capable of applying a first fluid to the feature side and a second fluid to the non-feature side is included.

In yet another embodiment, an apparatus capable of simultaneously applying different cleaning schemes to a feature side surface and a backside surface of a semiconductor substrate is provided. The apparatus is configured to support the semiconductor substrate with the feature side surface oriented face-up. The apparatus includes a chamber housing a feature side cleaning tool and a back side cleaning tool. The feature side cleaning tool is configured to transfer megasonic energy to the feature side surface through a fluid disposed on the feature side surface. The backside cleaning tool is configured to scrub the backside surface with a brush.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a system, apparatus and method that provides simultaneous cleaning for opposing sides of a semiconductor substrate. In one embodiment, a megasonic cleaning scheme optimized for a feature side of a patterned substrate is applied simultaneously with a brush cleaning scheme. It will be obvious, however, to one skilled in the art, that the present invention may be practiced without some or all of these specific details. In other instances, well known process operations have not been described in detail in order not to unnecessarily obscure the present invention. FIGS. 1A and 1B are described in the "Background of the Invention" section.

The embodiments of the present invention provide a system and method for optimizing the cleaning efficiency of patterned substrates. As used herein, substrate and wafer are interchangeable. Since the opposing sides of a semiconductor substrate are different, the optimum cleaning techniques corresponding to each side are different. Thus, the embodiments described below apply different cleaning schemes simultaneously in a single processing chamber. Thus, the processing time is reduced as the substrate no longer undergoes separate cleaning operations for each side. In addition, the footprint of the equipment performing the simultaneous cleaning is reduced. In one embodiment, a megasonic cleaning technique is applied to a feature side of the substrate and a brush cleaning technique is applied to the non-feature side of the substrate. As used herein, the term front side generally refers to the feature side and the term back side generally refers to the non-feature side. The megasonic cleaning technique enables the use of specially formulated cleaning chemistries to be applied to the feature side. Furthermore, the megasonic cleaning technique enhances the chemical activity by modifying the boundary layer conditions to improve mass transport. The brush cleaning technique is optimal for the particle cleaning of the planar back side surface. It will be apparent to one skilled in the art that the embodiments described below may be applied before or after any suitable semiconductor processing operation where the substrate requires cleaning.

Figure 2:
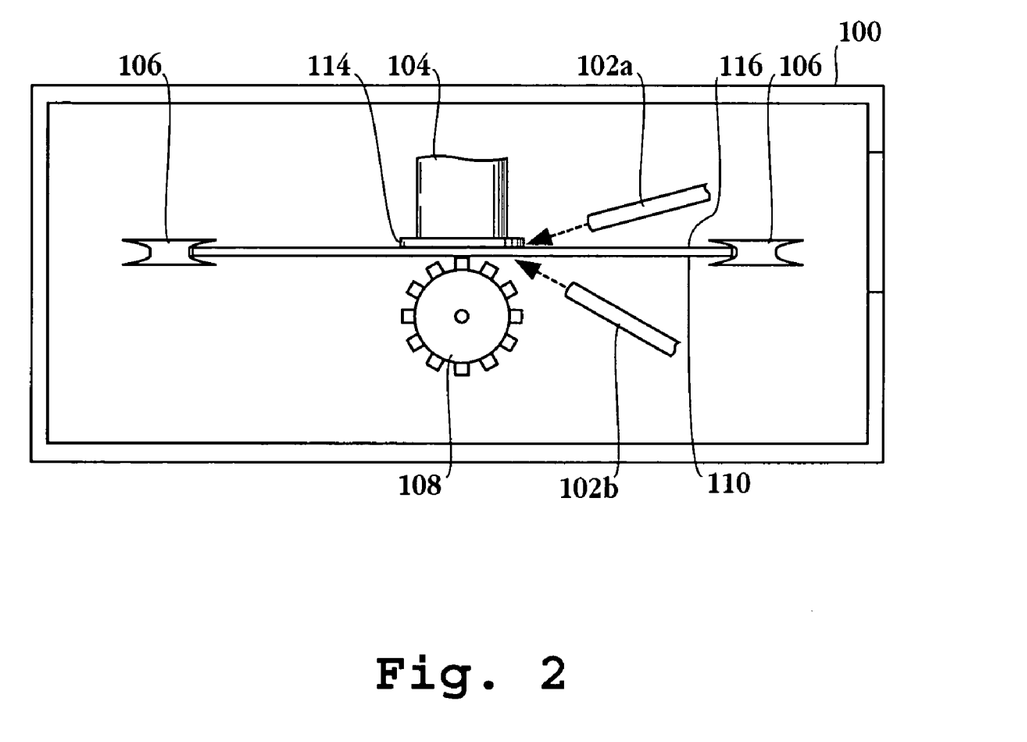
FIG. 2 is a simplified schematic diagram of a cleaning chamber configured to simultaneously apply alternative cleaning schemes to opposing sides of a substrate in accordance with one embodiment of the invention.

FIG. 2 is a simplified schematic diagram of a cleaning chamber configured to simultaneously apply alternative cleaning schemes to opposing sides of a substrate in accordance with one embodiment of the invention. Cleaning chamber 100 includes a front side megasonic cleaning apparatus and a backside brush cleaning apparatus. Megasonic transducer 104 is applied to the front side of substrate 110 while brush 108 cleans the back side of substrate 110. It should be appreciated that the front side of substrate 110 is the feature side having the patterned features disposed thereon. The back side of substrate 110 is the planar opposing side to the patterned features. As mentioned above, it is more effective to apply a megasonic cleaning scheme to the front side and a brush cleaning scheme to a back side of substrate 110. More importantly, the different cleaning schemes are applied simultaneously to the substrate within the cleaning chamber, thereby increasing throughput.

Cleaning fluid is delivered to substrate 110 through delivery line 102a for the front side and delivery line 102b for the back side. Alternatively, the cleaning fluid 102b may be applied through the brush roller. The cleaning fluid forms layer 116 over the front side surface of substrate 110 and meniscus 114 is formed between transducer 104 and substrate 110, thereby coupling a bottom surface of megasonic transducer 104 to a surface of substrate 110. It should be appreciated that the cleaning fluid may be any suitable cleaning fluid, e.g., SC1, deionized water, or any other suitable single wafer cleaning chemistry. The megasonic cleaning configuration effectively cleans particles lodged within the features from, for example, post-etch or post-metrology processing points, while a brush cleaning apparatus effectively removed particles from the backside of a substrate. Rollers 106 support substrate 110 during the cleaning operation. In one embodiment, brush 108 is configured to rotate substrate 110 as the substrate is being cleaned. In addition, megasonic transducer 104 may be moved radially across the surface of substrate 110 during the cleaning operation. For example, megasonic transducer 104 may be coupled to an arm which moves the transducer over the surface of the rotating substrate. Support mechanisms generally known in the art may be used to support the megasonic cleaning apparatus and the brush cleaning apparatus within the cleaning chamber. One skilled in the art will appreciate that divergent chemistries are possible with the configuration described with reference to FIG. 2. That is, a first cleaning chemistry may be utilized for the megasonic cleaning on the front side while a second cleaning chemistry may be employed for the brush cleaning on the back side of substrate 110. Therefore, the cleaning chemistries may be customized for particular cleaning operations to provide optimum efficacy.

Figure 3A:
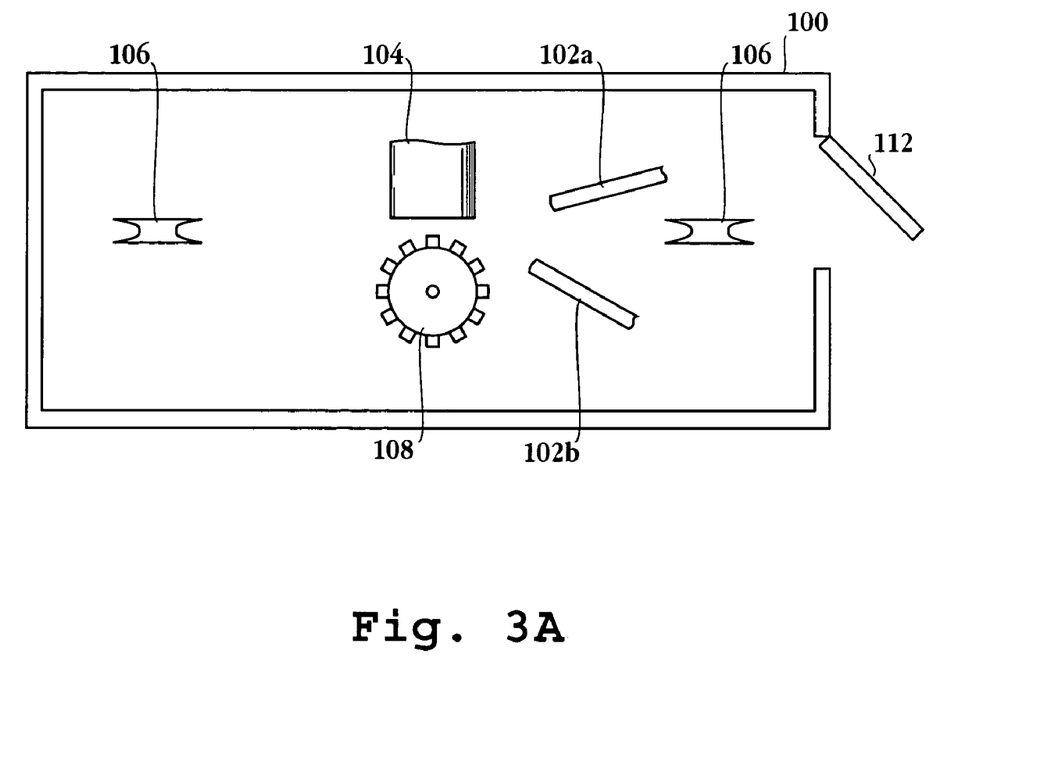
FIGS. 3A through 3C are schematic diagrams successively illustrating a cleaning scheme associated with a meniscus megasonic configuration in accordance with one embodiment of the invention.
Figure 3B:
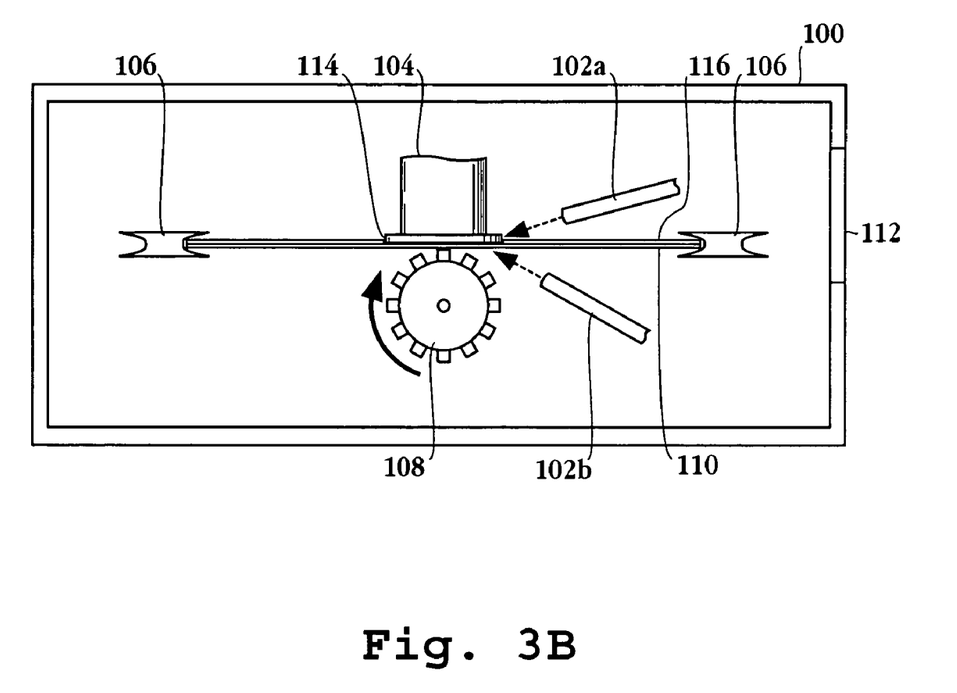

FIGS. 3A through 3C are schematic diagrams successively illustrating a cleaning scheme associated with a meniscus megasonic configuration in accordance with one embodiment of the invention. Cleaning chamber 100 includes megasonic transducer 104 and brush 108. Also included are rollers 106 and fluid delivery lines 102*a* and 102*b*. Initially, door 112 of cleaning apparatus 100 is opened in order for a substrate to be loaded, as illustrated in FIG. 3A. It will be apparent to one skilled in the art that any suitable robotic transport mechanism may be used for loading and unloading the substrate from cleaning chamber 100. Moving to FIG. 3B, the substrate is introduced into cleaning chamber 100 and door 112 is closed. Cleaning chemistry is applied to the top surface (patterned surface) of substrate 110 through delivery line 102*a*, thereby forming layer 116 on top of substrate 110. Simultaneously, cleaning fluid is delivered through nozzle 102*b* to the back side of substrate 110 while brush 108 is rotating in order to clean the back side of substrate 110.

Figure 3C:
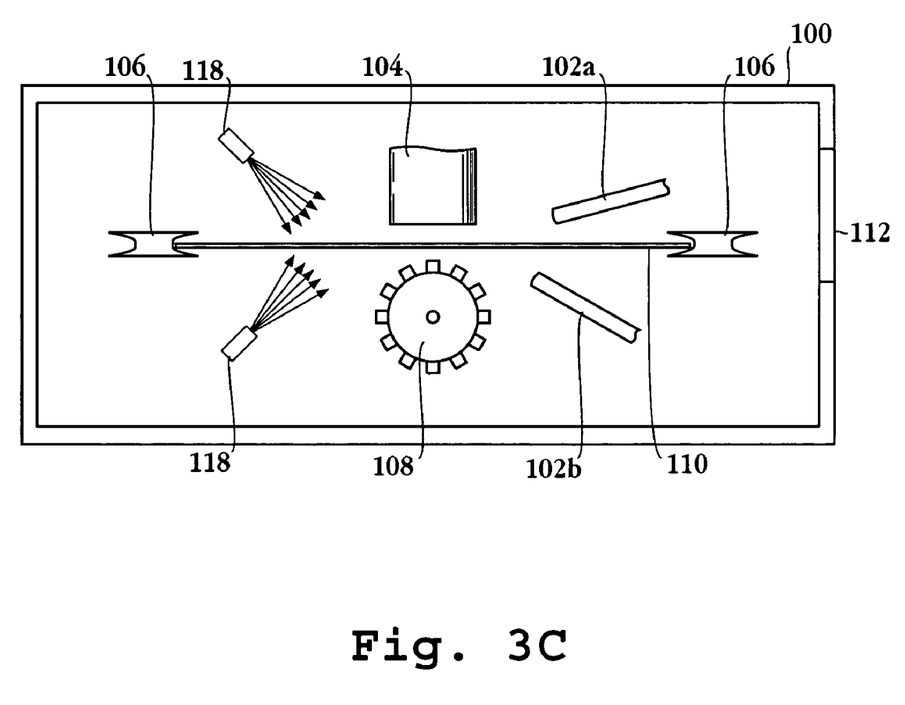

It should be appreciated that transducer 104 and brush 108 have the capability of moving in both a vertical and a horizontal direction. In one embodiment, cleaning fluid may be delivered through brush 108 rather than having a separate delivery nozzle 102*b*. Meniscus 114 forms between the bottom surface of megasonic transducer 104 and the top surface of substrate 110, thereby coupling megasonic transducer 104 to substrate 110. Once the surfaces of substrate 110 have been cleaned, i.e., the feature side surface has been cleaned by megasonic transducer 104 and the back side surface has been cleaned by brush 108, cleaning chemistry is no longer delivered to the front and back side surfaces of substrate 110 through delivery lines 102*a* and 102*b*, respectively. The front and back side surfaces of substrate 110 are then rinsed with a suitable rinsing agent, e.g., deionized water, through nozzles 118, as illustrated in FIG. 3C. In one embodiment, the cleaned substrate is then transferred from cleaning apparatus 100 to a drying chamber through door 112. In one embodiment, a bevel edge cleaner is included to effectively clean the edges of the substrate. The bevel edge cleaner may be a separate roller that contacts the edge of the substrate.

Figure 4:
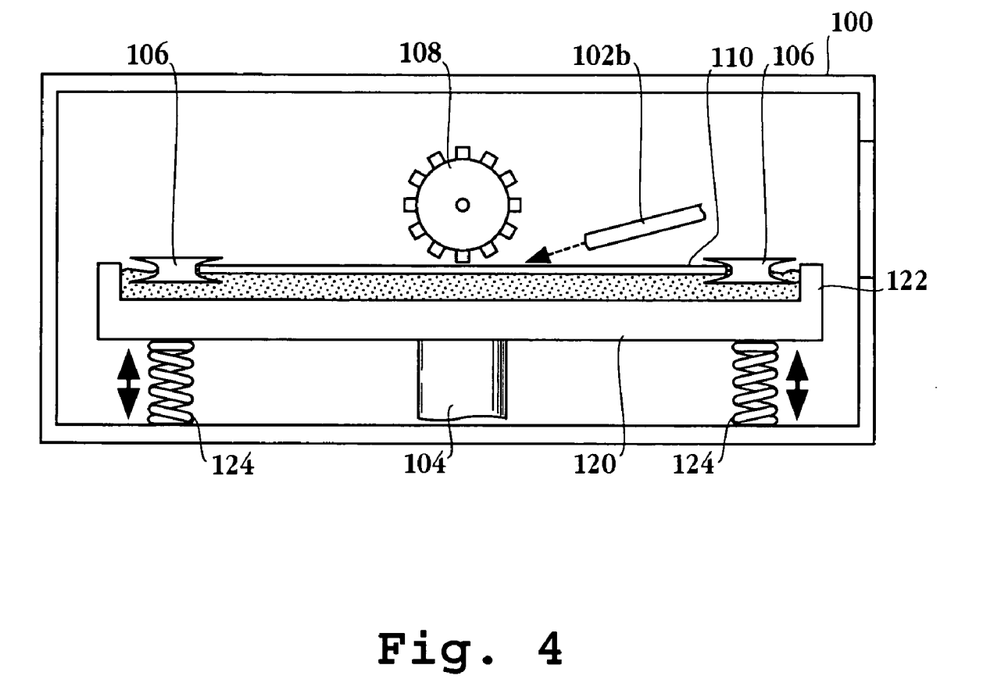
FIG. 4 is a simplified schematic diagram of a cleaning apparatus in which an immersion megasonic cleaning scheme is used along with a brush scrub scheme in accordance with one embodiment of the invention.

FIG. 4 is a simplified schematic diagram of a cleaning apparatus in which an immersion megasonic cleaning scheme is used along with a brush scrub scheme in accordance with one embodiment of the invention. Here, cleaning chamber 100 includes reservoir 122 which is filled with a cleaning fluid in which the patterned surface of substrate 110 is immersed. Here, the patterned surface is face-down rather than face-up, as in the meniscus megasonic cleaning configuration of FIGS. 2–3C. The patterned surface is cleaned through megasonic energy generated through megasonic transducer 104 which is affixed to a bottom surface of reservoir 122. Reservoir 122 is capable of moving in a vertical direction by extending or relaxing legs 124. Substrate 110 is supported by rollers 106 and the substrate rotates when brush 108 rotates against the non-immersed side of substrate 110. Here, the non-immersed side is the backside of the substrate and is face-up in this embodiment. Nozzle 102*b* delivers cleaning fluid to the non-immersed side of substrate 110 in order for brush 108 to clean the non-immersed side. As mentioned above, cleaning fluid may be delivered directly through brush 108 rather than through delivery nozzle 102*b*.

Figure 5A:
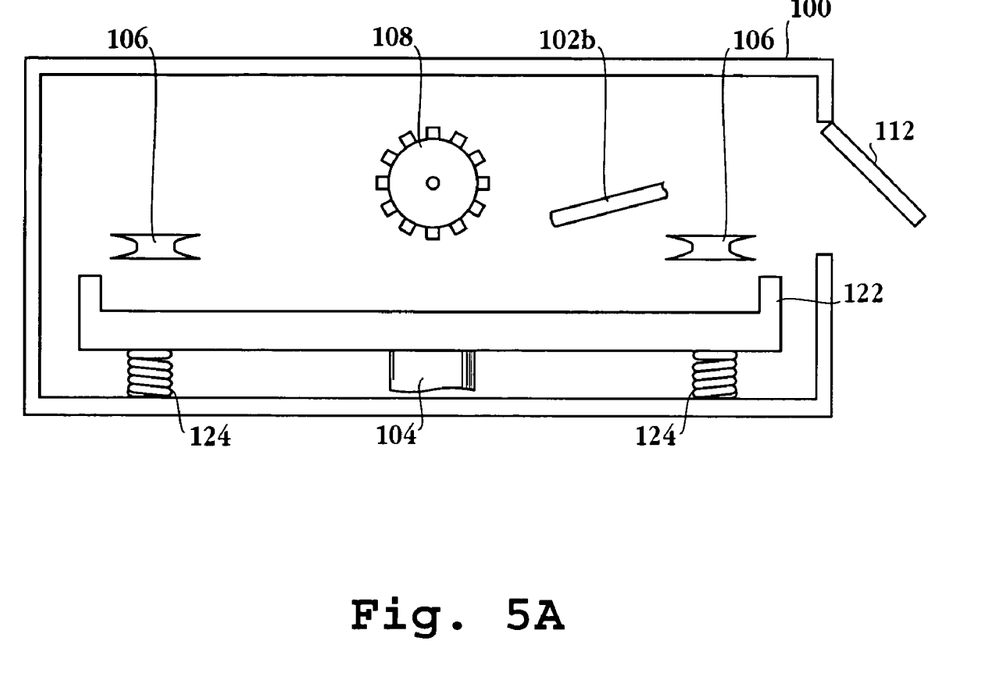
FIGS. 5A through 5D are schematic diagrams illustrating a cleaning scheme to be used with an immersion megasonic configuration and a brush configuration in accordance with one embodiment of the invention.
Figure 5B:
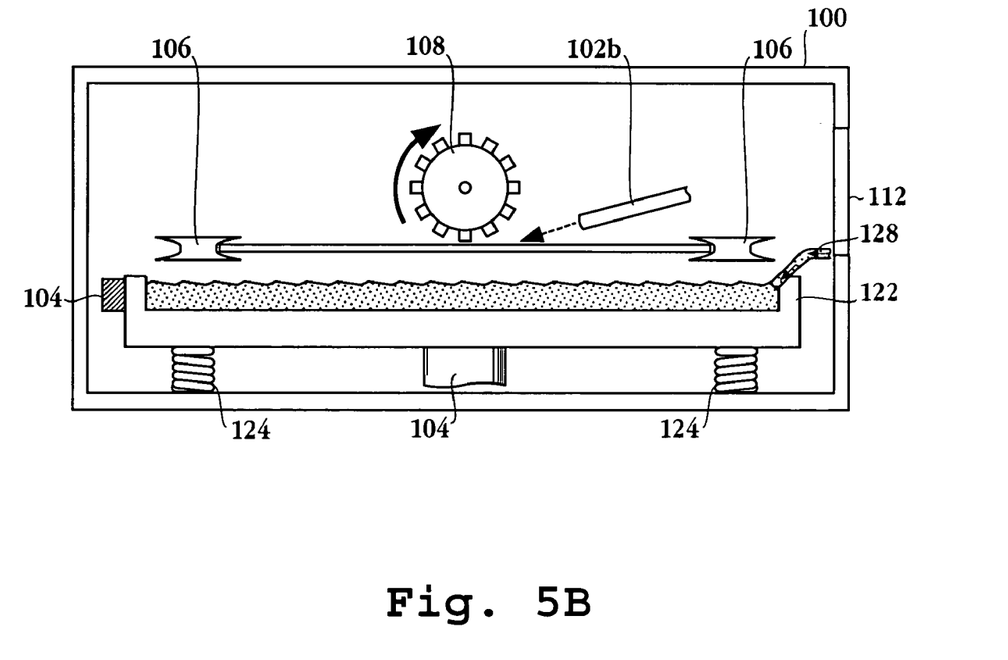
Figure 5C:
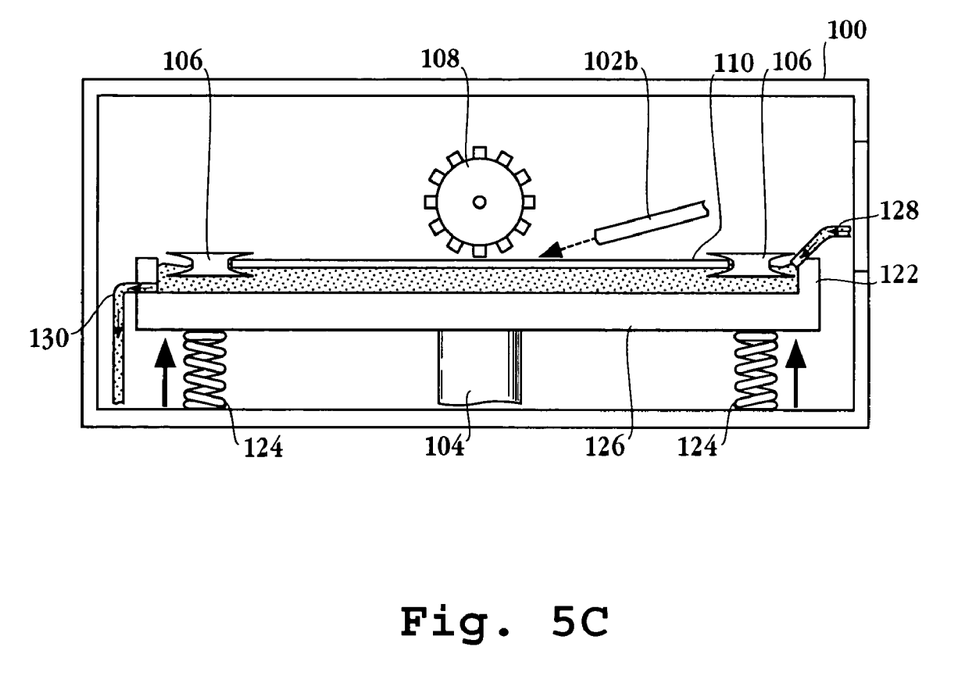
Figure 5D:
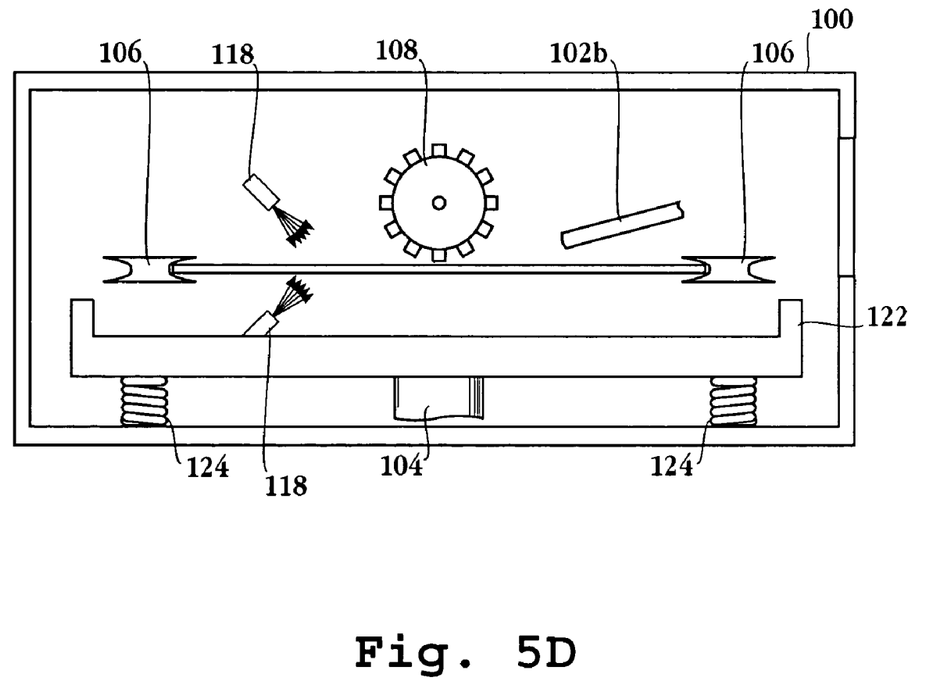

FIGS. 5A through 5D are schematic diagrams illustrating a cleaning scheme to be used with an immersion megasonic configuration and a brush configuration in accordance with one embodiment of the invention. FIG. 5A is a schematic diagram illustrating cleaning chamber 100 having door 112 opened in order to introduce a substrate into the cleaning chamber. Cleaning chamber 100 includes rollers 106 for supporting a substrate. Brush 108 is capable of brushing a non-feature side of a substrate while delivery line 102*b* supplies cleaning fluid to the non-feature side. Reservoir 122, supported by legs 124 which may be extended and retracted vertically, is included. Megasonic transducer 104 is affixed to a base of reservoir 122 in order to apply megasonic energy to a fluid introduced into the reservoir. An additional megasonic transducer may be affixed to a side of reservoir 122, as illustrated in FIG. 5B. Moving to FIG. 5B, substrate 110 has been introduced into chamber 100 through door 112 which is subsequently shut. Substrate 110 is supported by rollers 106. Cleaning fluid for the non-feature side is supplied through delivery nozzle 102*b* and brush 108 begins to rotate to clean the non-feature side of substrate 110. The rotation of rollers 106 against the edge of substrate 110 causes the substrate to rotate. At the same time, reservoir 122 is filled with a cleaning solution through fluid supply line 128 for cleaning the feature side of substrate 110. One skilled in the art will appreciate that any number of suitable schemes may be used to introduce fluid into reservoir 122. As illustrated in FIG. 5C, once reservoir 122 has been filled, the reservoir is raised by extending legs 124 in order to bring the feature side of substrate 110 into contact with the cleaning fluid contained within the reservoir without entirely submerging all of substrate 110. Continuous re-circulation of the fluid within reservoir 122 may be maintained by the introduction of fluid through supply line 128 and the reclaiming of overflow through line 130. Transducer 104 is activated to introduce megasonic energy into the cleaning fluid within reservoir 122 in order to clean the feature side of substrate 110. Once the cleaning has been completed, reservoir 122 is lowered and emptied as illustrated in FIG. 5D. The cleaning chemistry from delivery line 102*b* is stopped. Substrate 110 is then rinsed on the feature and non-feature sides through a rinsing agent delivered through nozzles 118 as illustrated in FIG. 5D. It should be appreciated that the rinsing agent may be any suitable rinsing agent.

Megasonic transducer 104 is oriented substantially parallel to the surface of substrate 110 being cleaned. In one embodiment, megasonic transducer 104 may be oriented substantially perpendicular to the surface of substrate 110 as illustrated in FIG. 5B. In another embodiment, two megasonic transducers may be employed where one transducer is affixed to the bottom of reservoir 122, while the second transducer is affixed to the side of reservoir 122. Further details on the parallel and/or perpendicular orientation of the megasonic transducers may be found in U.S. patent application Ser. No. 10/371,603 entitled "Method And Apparatus For Megasonic Cleaning Of Patterned Substrates." This application is hereby incorporated by reference in its entirety for all purposes.

Figure 6:
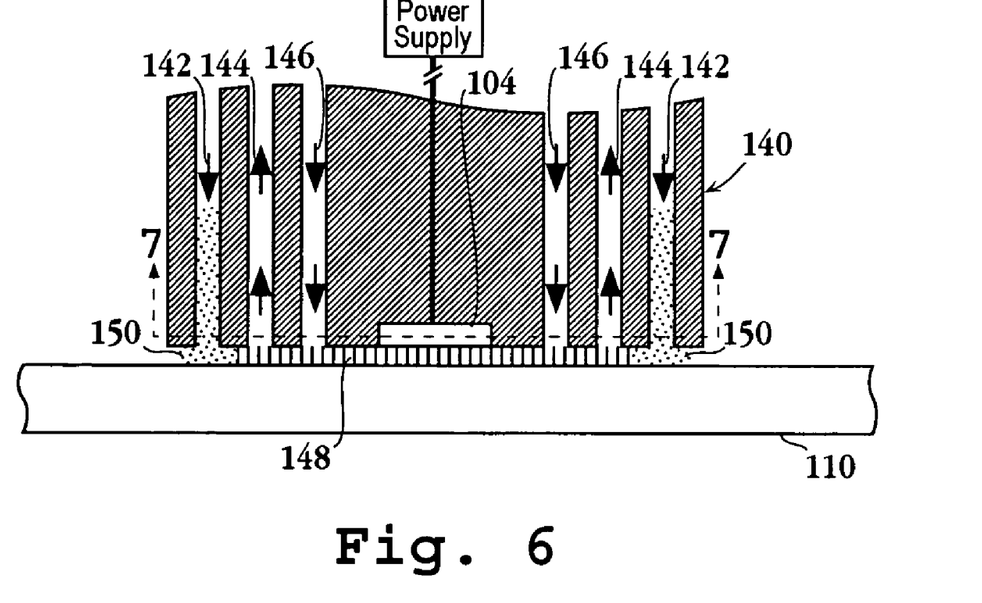
FIG. 6 is a simplified schematic diagram illustrating a cross-sectional view of an alternative embodiment of the megasonic cleaning device, where a megasonic transducer is embedded within a proximity head in accordance with one embodiment of the invention.

FIG. 6 is a simplified schematic diagram illustrating a cross-sectional view of an alternative embodiment of the megasonic cleaning device, where a megasonic transducer is embedded within a proximity head in accordance with one embodiment of the invention. It should be appreciated that this embodiment is used with the meniscus megasonic configuration described above. Proximity head 140 includes megasonic transducer 104 embedded therein. Two inlets and an outlet are defined within proximity head 140. Inlet 146 is used to supply a cleaning fluid through proximity head 140 to the surface of substrate 110. Outlet 144 is a vacuum outlet. Inlet 142 applies a retaining fluid such as IPA vapor, thereby causing a meniscus to be maintained in region 148. The IPA vapor and the cleaning fluid are evacuated through vacuum outlet 144. Region 150 acts as a barrier in order to retain cleaning fluid in region 148, which is defined underneath megasonic transducer 104 and above substrate 110 during the cleaning of the substrate.

Figure 7:
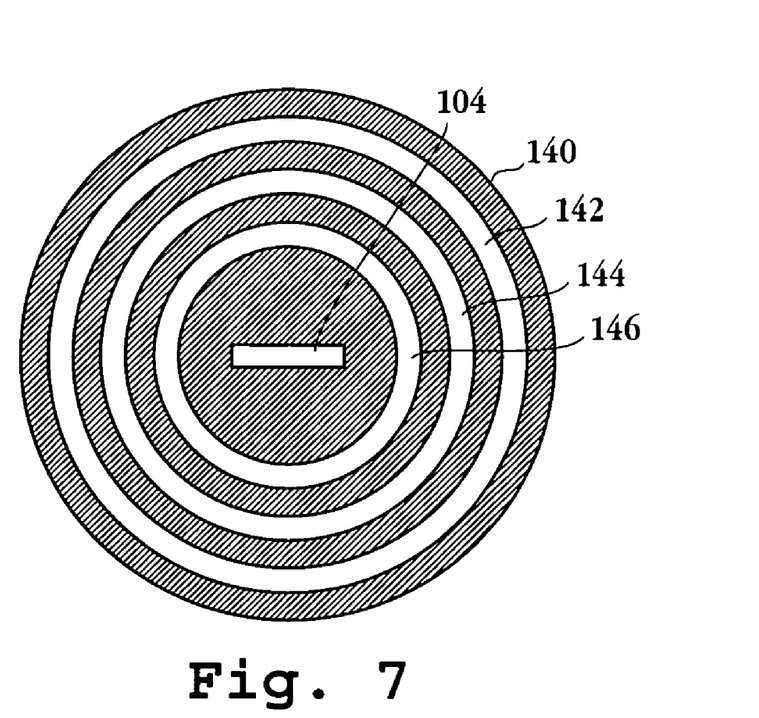
FIG. 7 is a schematic diagram illustrating a bottom view of the proximity sensor in accordance with one embodiment of the invention.

FIG. 7 is a schematic diagram illustrating a bottom view of the proximity sensor in accordance with one embodiment of the invention. As can be seen, the inlet and outlets are configured as concentric rings around megasonic transducer 104. Thus, inlet 146 surrounds megasonic transducer 104. Outlet 144 is positioned in between inlet 146 and inlet 142. As described with reference to FIG. 6, inlet 146 applies the cleaning fluid which couples megasonic transducer to the surface of the substrate being cleaned. Inlet 142 introduces a fluid that acts as a barrier in order to maintain the meniscus under transducer 104 while outlet 144 evacuates the cleaning fluid and the retaining fluid. It should be appreciated that the proximity sensor embodiments discussed herein are used with the meniscus megasonic embodiment described with reference to FIGS. 2–3C. Further details on the proximity head and sensor may be found in U.S. patent application Ser. No. 10/404,692 entitled "Method And System For Processing a Substrate using a Dynamic Liquid Meniscus" and U.S. patent application Ser. No. 10/611,140 entitled "Method and Apparatus for Cleaning a Substrate Using Megasonic Power." These applications are hereby incorporated by reference in their entirety for all purposes.

Figure 8:
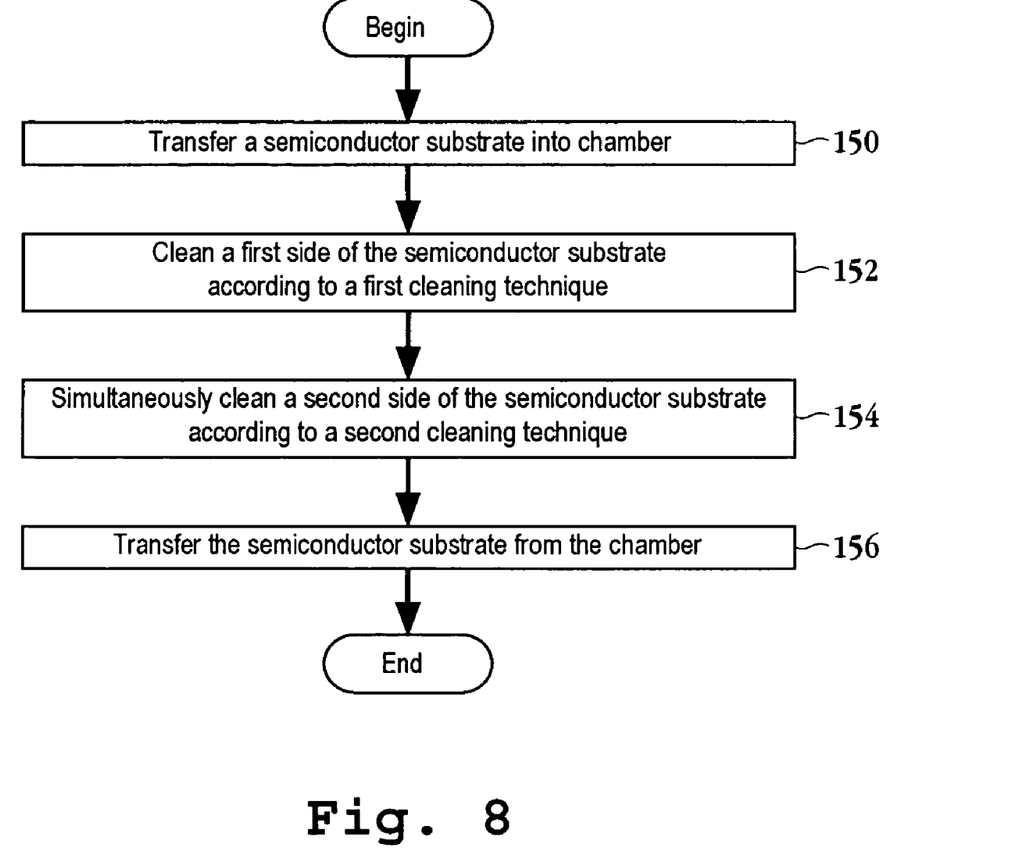
FIG. 8 is a flow chart diagram illustrating the method operations for cleaning a semiconductor substrate in accordance with one embodiment of the invention.

FIG. 8 is a flow chart diagram illustrating the method operations for cleaning a semiconductor substrate in accordance with one embodiment of the invention. The method initiates with operation 150 where a semiconductor substrate is transferred into a cleaning chamber. For example, the chamber illustrated with reference to FIGS. 2–5 is one exemplary cleaning chamber. The method then advances to operation 152 where a first side of a semiconductor substrate is cleaned according to a first cleaning technique. Here, a feature side of the semiconductor substrate may be cleaned according to a megasonic cleaning operation. The megasonic cleaning configuration can be either a meniscus megasonic cleaning configuration as described above, or an immersion megasonic cleaning configuration as described above.

The method of FIG. 8 then proceeds to operation 154 where simultaneously with cleaning a first side, a second side of the semiconductor substrate is cleaned according to a second cleaning technique. For example, the second side of the semiconductor substrate may be cleaned according to a brush technique, where the second side is a back side, or non-feature side, of the substrate. As brush rollers are recognized for their ability to remove particles on planar surfaces, such as the backside of the wafer, or the front side of a post-CMP cleaned on a planarized surface, the brush rollers will be more effective on the back side of the substrate than megasonic cleaning. Megasonic cleaning techniques are useful for assisting particle removal on both planar surfaces, as well as from high aspect ratio features. On planar surfaces, however, the brush roller is superior to the megasonic technique in most instances. Additionally, the megasonic technique is less likely to damage the features on a featured side of a patterned wafer. Thus, the combination of the brush roller and the megasonic cleaning configuration, being simultaneously applied, allows for a best of breed cleaning application. Additionally, the throughput is increased as a result of simultaneously cleaning both sides effectively of the substrate. The method of FIG. 8 then moves to operation 156 where the semiconductor substrate is transferred from the chamber.

Figure 9:
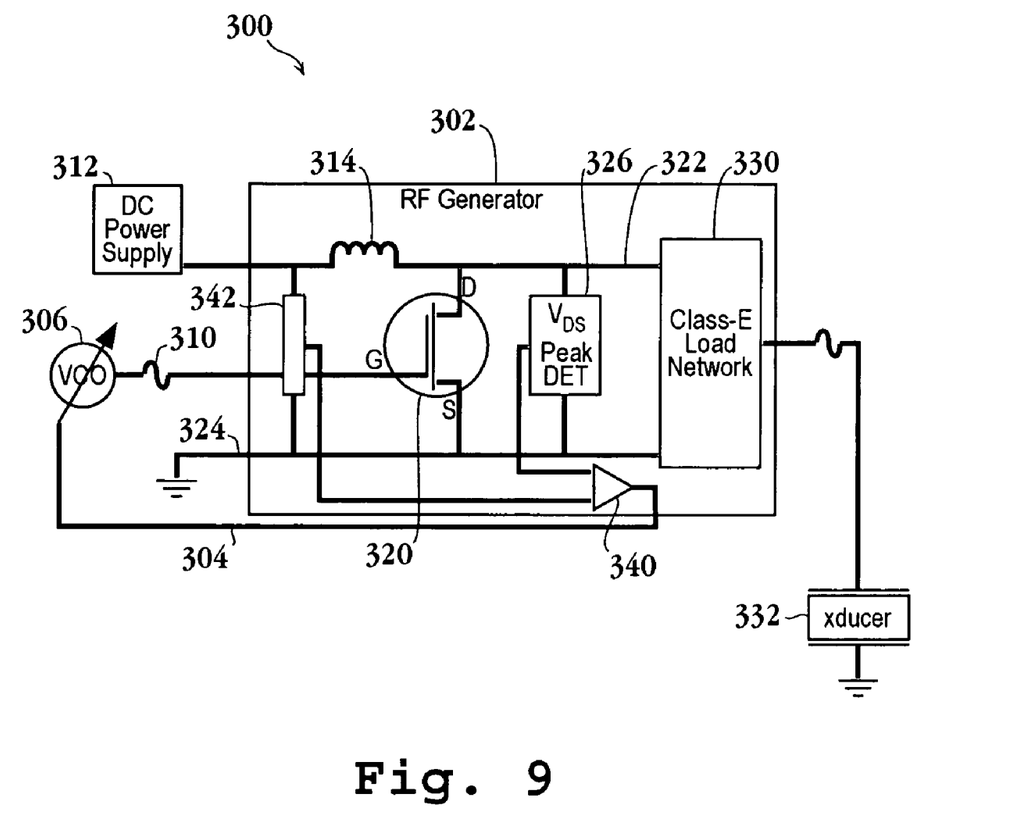
FIG. 9 is a simplified schematic diagram of an auto-tuning radio frequency (RF) generator system which may be incorporated with the megasonic transducer cleaning configuration in accordance with one embodiment of the present invention.

FIG. 9 is a simplified schematic diagram of an auto-tuning radio frequency (RF) generator system which may be incorporated with the megasonic transducer cleaning configuration in accordance with one embodiment of the present invention. The auto-tuning RF generator 302 provides a feedback control signal to the voltage controlled oscillator (VCO) 306 so as to adjust the frequency of a VCO RF signal 310 output from the VCO 306. The VCO 306 can also be included as part of the RF generator 302. A direct current (DC) power supply 312 is included and provides DC power for the amplification of the VCO RF signal 310 in the RF generator 302. The auto-tuning RF generator 302 includes an inductor 314 in the input portion of the RF generator 302. One or more amplifiers 320 that amplify the VCO RF signal 310 are also included in the RF generator 302.

In one embodiment, the amplifier 320 is a CMOS and the VCO RF signal 310 is applied to a gate G. A drain D is coupled to DC bias rail 322 and a source S is coupled to a ground potential rail 324. A peak voltage drain to source (peak $V_{ds}$) detector 326 is coupled across the drain D and source S terminals of the amplifier 320 so as to capture the peak voltage drain to source of the amplifier 320.

The output of the amplifier 320 is coupled to an input of a class-E load network 330. The class-E load network 330 is a common device well known in the art for performing large-scale impedance matching functions between an RF source (i.e., RF generator 302) and an RF load (i.e. transducer 332). The class-E load network 330 typically includes a LC network. An output of the class-E load network 330 is coupled to an input to the transducer 332. Further details on the auto-tuning implementation for the megasonic cleaning scheme may be found in U.S. patent application Ser. No. 10/360,322, entitled "Improved Megasonic Cleaning Efficiency Using Auto-Tuning of an RF Generator at Constant Maximum Efficiency." This application is hereby incorporated by reference in its entirety for all purposes.

Figure 10:
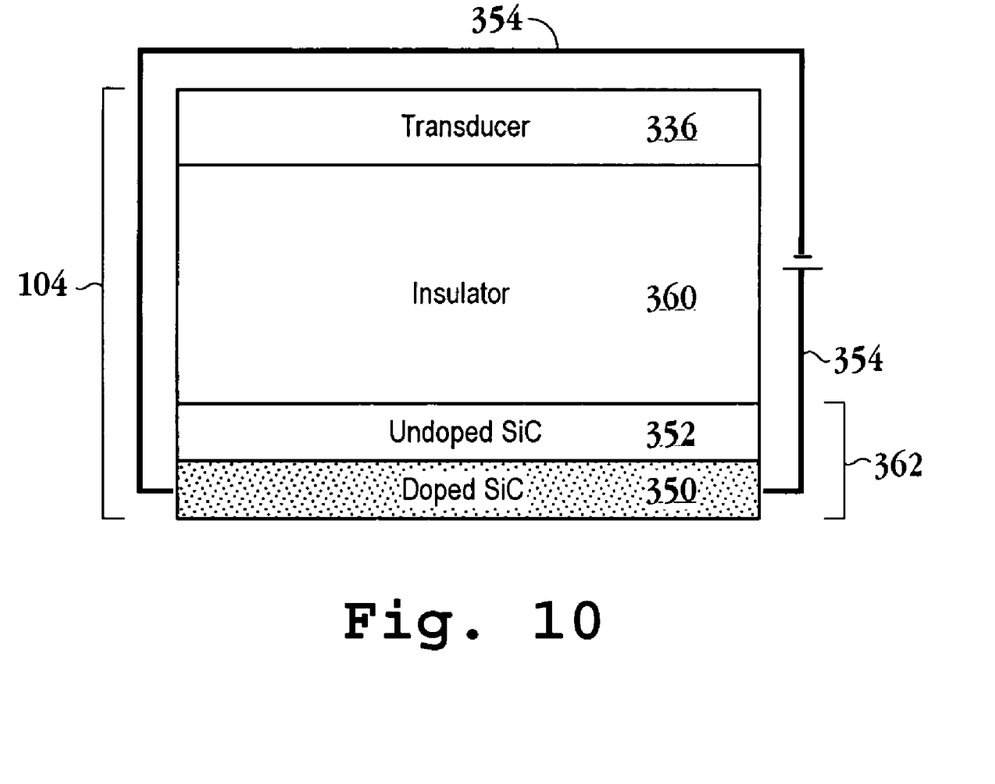
FIG. 10 is a schematic diagram of the components of a megasonic cleaner configured to provide localized heating in accordance with one embodiment of the invention.

FIG. 10 is a schematic diagram of the components of a megasonic cleaner configured to provide localized heating in accordance with one embodiment of the invention. Megasonic cleaner 104 includes transducer 336 is disposed over insulator 360 which is disposed over SiC layer 352. Bottom layer 350 of SiC layer 352 is doped to reduce the resistivity of the bottom layer. In one embodiment, the dopant concentration is between about $10^{11}$ atoms/cm$^2$ and about $10^{19}$ atoms/cm$^2$. In a preferred embodiment, the dopant concentration is between about $10^{13}$ atoms/cm$^2$ and about $10^{17}$ atoms/cm$^2$. Thus, when a current is applied across doped bottom layer 350, resistive heating of the doped layer will occur. Wires 354 provide a conduit between doped bottom layer 350 to apply a voltage differential across the doped bottom layer. Thus, an electrical current can be applied across doped bottom layer 350 to locally heat a liquid in contact with the doped layer. It should be appreciated that insulator layer 360 insulates transducer 336 from any heat from the resonator, i.e., SiC layer 352 and doped bottom layer 350. In one embodiment, insulator layer 360 is composed of sapphire. Thickness 362 of SiC layer 352 is between about 0.01 mm and about 7 mm. More preferably, thickness 362 is between about 1 mm and about 5 mm. Of course, depending on the configuration of the SiC the thickness may vary accordingly.

Insulator 360 of FIG. 10 has a thickness between about 1 mm and about 5 mm. One skilled in the art will appreciate that transducer 336, insulator 360 and SiC layer 352 are affixed to each other through an adhesive bond. While the bottom surface of bottom layer 350 is shown as being substantially flat, in one embodiment the bottom surface is curved to allow for the improved penetration into high aspect ratio features. It should be appreciated that SiC layer 352 can be configured to have multiple resistive layers, where the multiple layers define different gradients of resistivity. The multiple resistive layers are stratified such that bottom doped layer 350 has the lowest resistivity and successive upper layers of the stratification within SiC layer 352 have increasing resistivity. Thus, the layer with the highest resistivity would be at the top of SiC layer 352, thereby offering greater protection to transducer 336 from heat generated through the current applied across bottom doped layer 350. Of course, the localized heating embodiment described herein would be used with the meniscus megasonic embodiment described with reference to FIGS. 2–3C and the proximity head embodiments of FIGS. 6 and 7. Further details on a megasonic cleaning configuration capable of providing localized heating may be found in U.S. patent application Ser. No. 10/112,639 entitled "In-Situ Local Heating Using Megasonic Transducer Resonator." This application is hereby incorporated in its entirety for all purposes.

In summary, the above described invention describes a hybrid system for simultaneously cleaning opposing sides of a substrate. Megasonic energy is applied to one surface of the substrate while a brush scrubs a second surface of the substrate. In one embodiment, the megasonic energy level is between about 0.1 watt/cm$^2$ and about 5 watt/cm$^2$. The bottom surface of the megasonic cleaner may be configured as any suitable shape. In addition, the surface area of the bottom surface of the megasonic cleaner is between about 5% and about 50% of the surface area of the semiconductor substrate in one embodiment. It should be appreciated that while the embodiments described above refer to megasonic energy, other suitable acoustic energy may be used, e.g., ultrasonic energy.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A system for cleaning a semiconductor substrate, comprising:
    a chamber configured to support the semiconductor substrate, the chamber including,
        an acoustic energy cleaning tool configured to be applied to a feature side of the semiconductor substrate, the acoustic energy cleaning tool having a first annular inlet for delivering a first fluid to the feature side surface, a second annular inlet defined around the first annular inlet for delivering a second fluid to the feature side surface and an annular outlet defined between the first annular inlet and the second annular inlet, the annular outlet configured to remove the first fluid and the second fluid, thereby causing a meniscus to form over a source of acoustic energy disposed within the feature side cleaning tool;
        a brush cleaning tool configured to be applied to a non-feature side of the semiconductor substrate while the feature side is being cleaned; and
        a fluid delivery system capable of applying a feature side fluid to the feature side and a non-feature side fluid to the non-feature side.

2. The system of claim 1, wherein the acoustic energy cleaning tool is a megasonic energy cleaning tool having a resonator coupled to the feature side through the first fluid.

3. The system of claim 1, wherein the acoustic energy cleaning tool and the brush cleaning tool simultaneously clean the corresponding feature side and non-feature side.

4. The system of claim 1, wherein the feature side is placed face up within the chamber.

5. The system of claim 4, wherein the acoustic energy cleaning tool is coupled to a surface of the feature side through the meniscus formed between the acoustic energy cleaning tool and the first fluid.

6. The apparatus of claim 1, wherein the first annular inlet applies a cleaning fluid to the feature side surface and the second annular inlet provides a retaining fluid to the feature side surface to maintain the cleaning fluid within a region defined below the first annular inlet.

7. An apparatus capable of simultaneously applying different cleaning schemes to a feature side surface and a backside surface of a semiconductor substrate, the apparatus configured to support the semiconductor substrate with the feature side surface oriented face-up, the apparatus comprising:
    a chamber housing a feature side cleaning tool and a backside cleaning tool, the feature side cleaning tool configured to transfer megasonic energy to the feature side surface through a fluid disposed on the feature side surface, the backside cleaning tool configured to scrub the backside surface with a brush, wherein the feature side cleaning tool includes a first annular inlet for delivering a first fluid to the feature side surface, a second annular inlet defined around the first annular inlet for delivering a second fluid to the feature side surface and an annular outlet defined between the first annular inlet and the second annular inlet, the annular outlet configured to remove the first fluid and the second fluid, thereby causing a meniscus to form over a source of acoustic energy disposed within the feature side cleaning tool.

8. The apparatus of claim 7, wherein the brush is configured to rotate the semiconductor substrate and the feature side cleaning tool is configured to move radially above the feature side surface.

9. The apparatus of claim 7, wherein the chamber further comprises:
    a feature side fluid delivery line capable of delivering a feature side fluid to the feature side surface; and
    a back side fluid delivery line capable of delivering a back side fluid to the backside surface.

10. The apparatus of claim 9, wherein the back side fluid delivery line is integrated within the brush.

11. The apparatus of claim 7, wherein the feature side cleaning tool is further configured to provide localized heating to elevate a temperature of the fluid in contact with a bottom surface of the feature side cleaning tool while propagating the megasonic energy through the fluid to the feature side of the semiconductor substrate.

12. The apparatus of claim 7, wherein the chamber includes rollers for supporting the semiconductor substrate.

13. The apparatus of claim 12, wherein one of the rollers is a bevel edge cleaner configured to remove material deposited proximate to an edge of the semiconductor substrate.

14. The apparatus of claim 7, wherein the first annular inlet applies a cleaning fluid to the feature side surface and the second annular inlet provides a retaining fluid to the feature side surface to maintain the cleaning fluid within a region defined below the first annular inlet.

* * * * *